United States Patent
Winkel

[15] 3,684,971
[45] Aug. 15, 1972

[54] DIFFERENCE AMPLIFIER

[72] Inventor: Jan te Winkel, Emmasingel, Eindhoven, Netherlands

[73] Assignee: U.S. Philips Corporation, New York, N.Y.

[22] Filed: July 6, 1970

[21] Appl. No.: 52,443

[30] Foreign Application Priority Data

July 23, 1969 Netherlands..............6911358

[52] U.S. Cl.....................................330/30 D, 330/69
[51] Int. Cl...................................................H03f 3/68
[58] Field of Search................................330/69, 30 D

[56] References Cited

UNITED STATES PATENTS 3,482,177 12/1969 Sylvan ......................330/69 X

*Primary Examiner*—Nathan Kaufman
*Attorney*—Frank R. Trifari

[57] ABSTRACT

A Darlington difference amplifier including two pairs of transistors in which the offset voltage is reduced by applying a compensation voltage to the input or to the output of the amplifier. This voltage contains, in a compensating sense, the error voltage caused by any difference between the current amplification factors of the output transistors. The compensation voltage is obtained by reproducing the base-emitter voltages of the input transistors of the amplifier in the PN junctions of one or more semiconductor elements traversed by the same current.

15 Claims, 6 Drawing Figures

INVENTOR.
JAN TE WINKEL
BY
AGENT

INVENTOR.
JAN TE WINKEL
BY

AGENT

INVENTOR.
JAN TE WINKEL
BY
AGENT

DIFFERENCE AMPLIFIER

The present invention relates to a difference amplifier and more particularly to a difference amplifier comprising two pairs of transistors in which the emitter electrodes of the first pair of transistors are connected to the base electrodes of the second pair. The emitter electrodes of the second pair of transistors are connected to each other and to one terminal of the supply source via a current source, whereas the collector electrodes are connected to the other terminal of the supply source via impedances. The difference amplifier also provides two pairs of terminals, one pair being connected to the base electrodes of the first pair of transistors and the second pair being connected to the side of the collector impedances of the second pair of transistors remote from the supply source.

In difference amplifiers having only two junction transistors, the input impedance is normally comparatively low because in order to obtain a sufficiently high output signal the steady-current adjustment of the transistors has to be high, so that the base current of the transistors also will be high. In order to obtain a higher amplification factor and a higher input impedance it is common practice to use the combination of two pairs of transistors. The difference amplifier then comprises two stages each having an input transistor and an output transistor adjusted to the linear working range. The input transistors only have to provide the base current of the output transistors so that the base current of the input transistors may be accordingly low and a high input impedance is achieved.

The invention is engaged with the fact that in such a circuit arrangement the difference between the current amplification factors of the two output transistors plays an important role, which difference may be 10 to 20 percent despite modern manufacturing processes. In addition, this difference is dependent upon temperature and time and becomes manifest in the collector currents of the input transistors. Therefore, with the same collector currents of the output transistors and in the absence of an input signal the base-emitter voltages of the input transistors will be different. This difference between the base-emitter voltages of the two input transistors, together with a small difference, if any, between the base-emitter voltages of the output transistors, determines the lack of symmetry of the amplifier. This lack of symmetry denotes herein the voltage which has to be applied to the input terminals of the difference amplifier in order to obtain zero output voltage. With a difference amplifier comprising only two transistors, only the latter component is concerned. Owing to the aforesaid fairly high difference between the amplification factors of the output transistors, the lack of symmetry of the said two-stage amplifier, termed herein a Darlington difference amplifier, is a factor 10 to 20 higher than the lack of symmetry of a difference amplifier comprising only two transistors. The gain in input impedance and amplification factor is therefore achieved at the expense of a greater lack of symmetry.

An object of the invention is to drastically reduce this lack of symmetry of the Darlington difference amplifier.

The invention features a compensation voltage which is applied to one of said pairs of terminals. This voltage contains in a compensating sense the error voltage due to the difference between the amplification factors of the second pair of transistors and which is obtained by the reproduction of the base-emitter voltages of at least the first pair of transistors of the difference amplifier in the pn-junction of semiconductor elements traversed by the same current. It is thus possible to apply this compensation voltage both to the output terminals and to the input terminals of the difference amplifier. In the first case the output impedance is raised by an amount such that the overall output voltage is independent of the difference between the amplification factors of the output transistors. In the second case the input voltage is raised by such an amount that the overall voltage at the input is independent of the difference between the amplification factors of the output transistors. The compensation voltage is obtained in both cases by using the error voltage contained in the base-emitter voltages of the transistors of the two pairs of transistors of the difference amplifier, as will be described more fully hereinafter.

When a signal voltage is applied between the base electrodes of the input transistors of a Darlington difference amplifier, this signal voltage is evenly distributed among the base-emitter junctions of the four transistors. The base-emitter voltage of each of the transistors therefore contains an equal portion of the signal voltage.

The difference between the current amplification factors of the output transistors produces, however, error voltages in the base-emitter voltages of these transistors. The base-emitter voltage of each of the input transistors exhibits the same error voltage as the next-following output transistor, but with opposite polarity. The base-emitter voltages of the input and output transistors of one stage therefore contain the signal voltage with the same polarity and the error voltage with opposite polarity, whereas the base-emitter voltages of the input and output transistors of one stage with respect to those of the input and output transistors of the other stage contain both voltages with opposite polarity, all voltages now being related to the two interconnected emitters of the output transistors.

By applying a suitably chosen base-emitter voltage to the base of a transistor and by adding the collector voltage of this transistor to one of the output voltages, the error voltage can be eliminated. As an alternative, the base-emitter voltage concerned may be applied through a transistor to the input voltage, which provides the same result.

Alternatively, two appropriate base-emitter voltages may be added so that a voltage can be obtained, which solely depends upon the error voltage. By applying this voltage, again via a transistor, to the input or output voltage, a compensation of the error voltage is obtained, as will be explained more fully with reference to the Figures.

In this method the base-emitter voltages of the transistors of the two pairs are not used in order to avoid loss of signals. According to one aspect of the invention the base-emitter voltages of these transistors are reproduced, for example, by causing the same current of the transistor concerned of the difference amplifier to traverse an additional transistor or diode. It is known that the base-emitter voltage of a transistor is accurately determined by the emitter current of the transistor and that it is possible to provide pn-junctions in which said dependence is the same.

The invention will be described with reference to the accompanying drawing in which.

Figure 5:
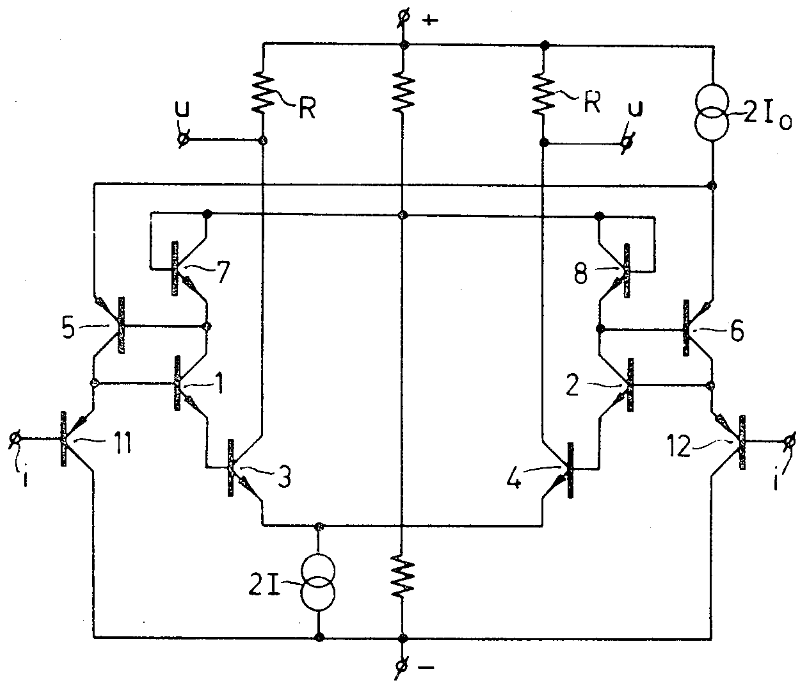

FIG. 3 a second,

FIG. 4 a third,

FIG. 5 a fourth and

Figure 6:
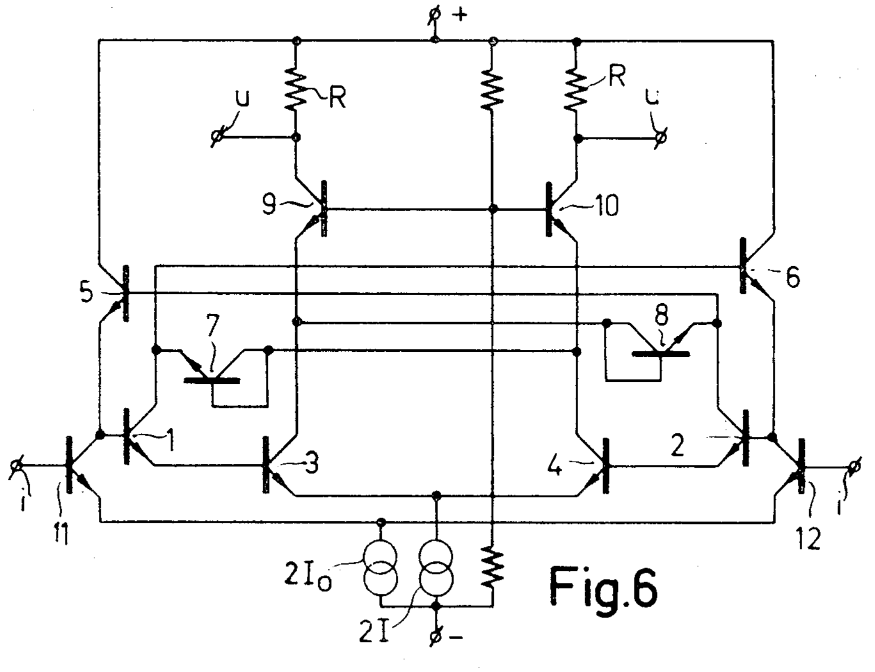

FIG. 6 a fifth embodiment of the circuit arrangement in accordance with the invention.

Figure 1:
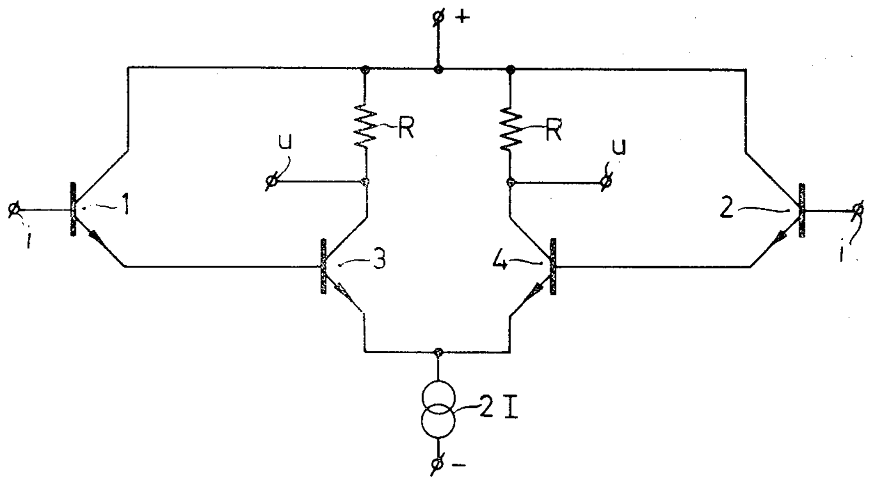
FIG. 1 shows a known difference amplifier comprising two pairs of transistors.

The difference amplifier shown in FIG. 1 comprises two stages having the input junction transistors 1 and 2 and the output junction transistors 3 and 4. The emitter electrodes of transistors of 3 and 4 are connected to each other and through a current source 2I to one terminal of the supply source, whereas their collector electrodes, which also form the output terminals *u*, are connected through impedances R to the other terminal of the supply source, to which terminal are also connected the collector electrodes of transistors 1 and 2. The input terminals *i* are formed by the base electrodes of transistors 1 and 2.

Assuming the collector currents of the transistors 3 and 4 to be equal to each other and the voltage between the output terminals *u* to be zero, the base-emitter voltages of these transistors will be substantially equal to each other. When the current amplification factor of transistor 3 is higher than that of transistor 4, the collector current of transistor 1 will be lower than that of transistor 2. Therefore the base-emitter voltage of transistor 1 will be lower than that of transistor 2. In order to obtain the situation described in the absence of an input signal, an additional voltage has to be applied between the input terminals, the so-called lack-of-symmetry-voltage, which is equal to the difference between the base-emitter voltages.

If no signal at all is applied to the input (terminals *i* are interconnected), the currents of the transistors 3 and 4 and of transistors 1 and 2 will be unequal to each other so that in this example the collector current of transistor 3 exceeds that of transistor 4, whereas the collector current of transistor 1 is lower than that of transistor 2. Viewed relatively the differences are equal and of opposite polarity and also equal to half the difference between the current amplification factors. These properties of the arrangement ensue from the condition that in the absence of any input signal the differences between the base-emitter voltages of the transistors 3, 4 and 1,2 in an absolute sense should be equal to each other and have opposite polarity.

Figure 2:
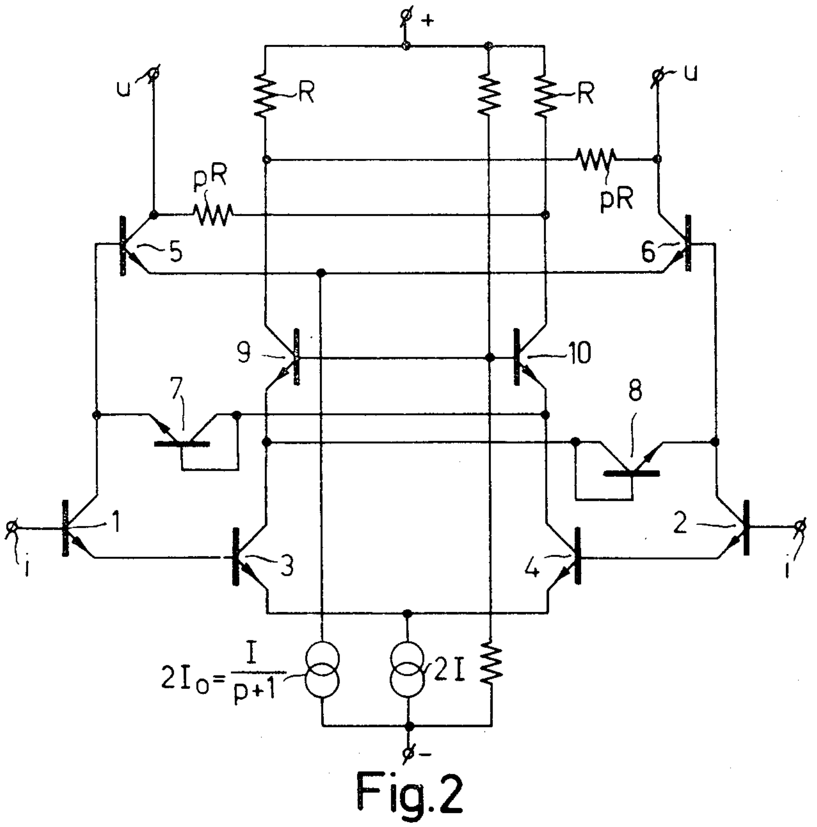
FIG. 2 shows a first.

This will be accounted for with reference to a calculation on the basis of FIG. 2. The difference amplifier shown in this Figure also comprises two stages having the input transistors 1 and 2 and the output transistors 3 and 4. The collector of transistor 3 is connected via the emitter-collector path of transistor 9 and an impedance R to the positive terminal of the supply source. The collector path of transistor 4 is connected similarly via the emitter-collector path of transistor 10 and another impedance R to the positive terminal of the supply source. The base electrodes of transistors 9 and 10 are at constant potential. The collector of transistor 3 is furthermore connected via a transistor 8, connected as a diode in the pass direction, to the collector of transistor 2, which in turn is connected to the base of a transistor 6. The collector of transistor 4 is connected via a transistor 7, connected as a diode in the pass direction, to the collector of transistor 1, which in turn is connected to the base of a transistor 5. The emitter electrode of transistors 5 and 6 are connected to each other and via a current source to the negative terminal of the supply source. The collectors of transistors 5 and 6 are connected via impedances $pR$ to the collectors of transistors 10 and 9, respectively. The collector electrodes of transistors 5 and 6 form, in addition, the output terminals *u*.

The operation of the circuit arrangement is based upon the assumption that a voltage is symmetrically applied to the input terminals so that the base of transistor 1 has a voltage $+2\Delta(kI/q)$and the base of transistor 2 has a voltage $-2\,\Delta(kT/q)$. These voltages are evenly divided among the base-emitter junctions of the input and output transistors. The base-emitter voltage of transistors 1 and 3 is thus raised due to the input signal by an amount $\Delta(kT/q)$ and the base-emitter voltage of transistors 2 and 4 is reduced by the same amount.

If the current amplification factors of transistors 3 and 4 are not equal to each other, which means that, for example, the current amplification factor of transistor 3 is equal to $\beta/1-2\delta$ and that of transistor 4 is equal to $\beta/1+2\delta$, it can be found by calculation that the collector current of transistor 3 is:

$Ic_3 = I(1 + \Delta + \delta\ )$ and the collector current of transistor 4 is:

$Ic_4 = I(1 - \Delta - \delta\ )$, wherein $I$ is the steady-current setting of the output transistors.

The base-emitter voltage of transistor 3 is then:

$Vbe_3 = Vbe_{03} + (\ \Delta + \delta\ )\ (kT/q)$ and the base-emitter voltage of transistor 4 is:

$V_{be4} = Vbe_{04} - (\Delta + \delta\ )(kT/q,)$ wherein $Vbe_{03} = Vbe_{04} =$ the value of the base-emitter voltage of transistor 3 and 4 in the rest position. Since the voltage between the base of transistor 1 and the emitter of transistor 3 has to be equal to the sum of $Vbe_{01}$, $Vbe_{03}$ and $2\Delta(kT/q)$, the base-emitter voltage of transistor 1 is $Vbe_1 = Vbe_{01} + (\Delta - \delta\ )(kT/q)$. In the same way it is found that the base-emitter voltage of transistor 2 is: $Vbe_2 = Vbe_{02} - (\Delta - \delta\ )(kT/q)$. Herein $Vbe_{01}$ and $Bbe_{02}$ are the values of the base-emitter voltages of transistors 1 and 2 in the rest position.

The current setting of the transistors 5 and 6 is chosen so that their base currents are negligible as compared with the collector currents of transistors 1 and 2. This means that the transistors 1 and 7 are traversed by substantially the same currents so that the base-emitter voltages of these transistors are accurately equal to each other. The same applies to the transistors 2 and 8.

If the current passing through transistor 8 is low as compared with the collector current of transistor 3, the transistors 3 and 9 are traversed by the same currents and their base-emitter voltages are accurately the same. The current through transistor 8 is equal to the collector current of transistor 2, which in turn is substantially equal to the base current of transistor 4. When transistors of high amplification factor are used, the current through transistor 8 will therefore be negligible as compared with the collector current of transistor 3. The base-emitter voltages of transistors 3 and 9 are therefore accurately equal to each other as is the base-emitter voltages of transistors 4 and 10.

The voltage at the base of transistor 5 is then equal to the constant voltage at the base of transistor 10 minus the sum of the base-emitter voltages of transistors 10 and 7 and hence is equal to said constant voltage minus the sum of the base-emitter voltages of transistors 4 and 1. The insertion of the expressions found for the base-emitter voltages of these transistors shows that the base voltage of transistor 5 is equal to a constant voltage plus 2 $\delta$ ($kt/q$). In the same way it will be found that the base voltage of transistor 6 is equal to a constant voltage minus 2 $\delta$ (kT/q). These base voltages are therefore no longer dependent upon the signal voltage $\Delta$ . The collector currents of transistors 5 and 6 are still dependent upon the steady-current setting of these transistors. If this is designated by $Io$, the collector current of transistor 5 is: $Ic_5 = Io(1 + 2\delta)$ and the collector current of transistor 6 is: $Ic_6 = Io(1 - 2\delta)$. If the over-all collector impedance of transistors 5 and 6 has a value of $(p + 1)R$, the voltage at the collector of transistor 5 is:

$Vu_5 = Ic_4R + Ic_5(p + 1)R = IR(1 - \Delta - \delta) + Io(1 + 2\delta)(p+1)R$.

In order to obtain complete compensation of the error voltage, it has to apply that $Io = I/2(p+1)$. The emitter current source which supplies the steady current for transistors 5 and 6 has therefore to be adjusted to a value $I/p+1$. The value of the impedance $pR$ in the collector circuits of the transistors 5 and 6 and the current amplification factors of these transistors are determined by the desire to restrict the base currents of these transistors. As stated above, these base currents have to be negligible as compared with the collector currents of the input transistors. By choosing transistors of very high amplification factor for transistors 5 and 6, it can of course be ensured that with a low base current the collector current is nevertheless sufficiently high for obtaining a sufficiently high compensation voltage with a low collector impedance (small value of $p$). As a limit $p$ may even be zero. However, in integrated circuits it is preferred to have transistors of the same current amplification factor so that the transistors 5 and 6 should have the same current amplification factors as the further transistors of the difference amplifier. In order to restrict the base currents of the transistors 5 and 6, it may then be necessary to choose a low steady-current setting for these transistors. In order to obtain nevertheless the correct compensation voltage it is then necessary to raise the collector impedance, i.e., the value of $p$.

If with a given steady-current setting of the transistors 5 and 6 the base current remains below the permissible value, the base current may even be increased. For transistor 5 this is possible by including between the emitter of transistor 10 and the collector of transistor 4 a number of transistors connected as diodes in the pass direction and between the collector of transistor 4 and the transistor 7 the same number. If the number of additional diodes in the two paths is designated by $n$, the voltage at the base of transistor 5, but for a constant voltage, has a value of $2(n + 1)\,\delta$. The same applies to the base voltage of transistor 6 by including a number of diodes between the emitter of transistor 9 and the collector of transistor 3 and the same number between the collector of transistor 3 and the transistor 8.

With a correct relationship between the steady-current setting and the collector impedances of the transistors 5 and 6 the collector voltage of transistor 5 is:

$$Vu_5 = IR(1 - \Delta - \delta) + \frac{I}{2(p+1)}(1 + 2\delta)(p+1)R = \tfrac{3}{2}IR - IR\Delta$$

and of transistor 6:

$$Vu_6 = IR(1 + \Delta + \delta) + \frac{I}{2(p+1)}(1 - 2\delta)(p+1)R = \tfrac{3}{2}IR + IR\Delta$$

so that these voltages depend only upon the input voltage $\Delta$ .

Figure 3:
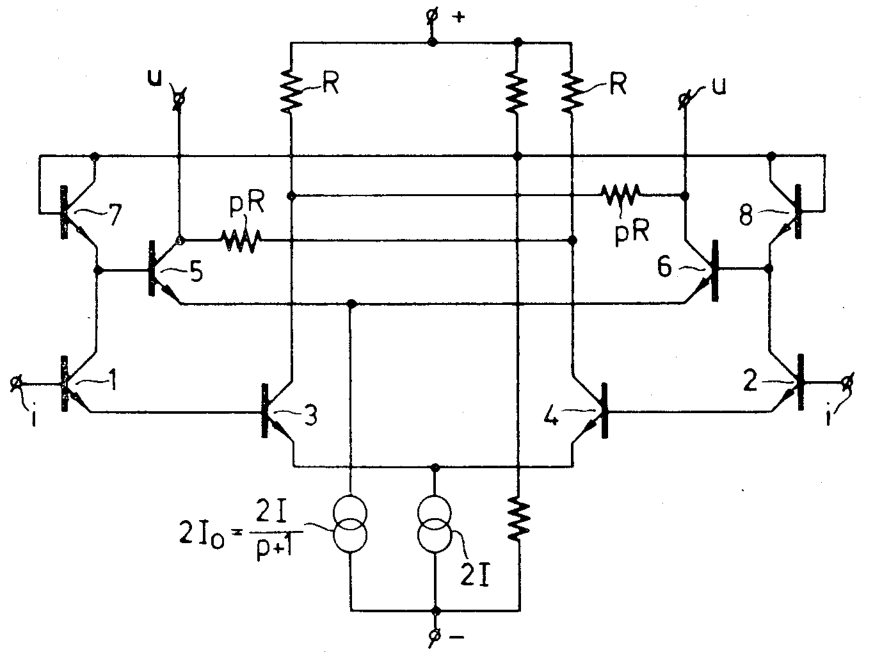

FIG. 3 shows a second embodiment of the difference amplifier in accordance with the invention, in which the collectors of transistors 3 and 4 are connected through impedances $R$ to the supply source. The collector electrodes of transistors 1 and 2 are connected via the emitter-collector paths of the transistors 7 and 8, connected as diodes, to a point of constant potential. The collector of transistor 1 is furthermore connected to the base of transistor 5, the collector of which is connected via an impedance $pR$ to the collector of transistor 4. The collector of transistor 2 is connected to the base of transistor 6, the collector of which is connected through an impedance $pR$ to the collector of transistor 3. The emitter electrodes of transistors 5 and 6 are connected to each other and through a current source to the negative supply terminal. The collector electrodes of transistors 5 and 6 again form the output terminals $u$.

If the base currents of transistors 5 and 6 are again negligible as compared with the collector currents of transistors 1 and 2, the base-emitter voltages of transistors 1 and 2 are reproduced in the transistors 7 and 8. The base voltage of transistor 5 is then, apart from the constant component: $(-\Delta + \delta)(kT/q)$.

If the steady current of transistor 5 is again designated by $Io$, the collector current is equal to $Ic_5 = Io(1 - \Delta + \delta)$. The output voltage at the collector of transistor 5 is then $Vu_5 = IR(1 - \Delta - \delta) + Io(1 - \Delta + \delta)(p + 1)R$. For a complete compensation of the error voltage it then has to apply that:

$Io = I/p+1$. The setting of the current source supplying the steady currents of transistors 5 and 6 has therefore to be: $2I/p+1$.

When this condition is satisfied, it applies to the collector voltage of transistor 5 that $Vu_5 = IR(1 - \Delta - \delta) + (I/p+1)(1 - \Delta + \delta)(p + 1)R = 2IR - 2IR\Delta$. As compared with the arrangement of FIG. 2, this circuit arrangement therefore has the advantage that the output voltage is increased and the number of transistors is reduced by two.

In this embodiment of the invention the value of $p$ may be reduced as well by choosing transistors of a high current amplification factor for transistors 5 and 6, while the base voltages of transistors 5 and 6 may again be increased by using a plurality of transistors connected as diodes in the collector circuits of transistors 1 and 2 instead of using one.

Figure 4:
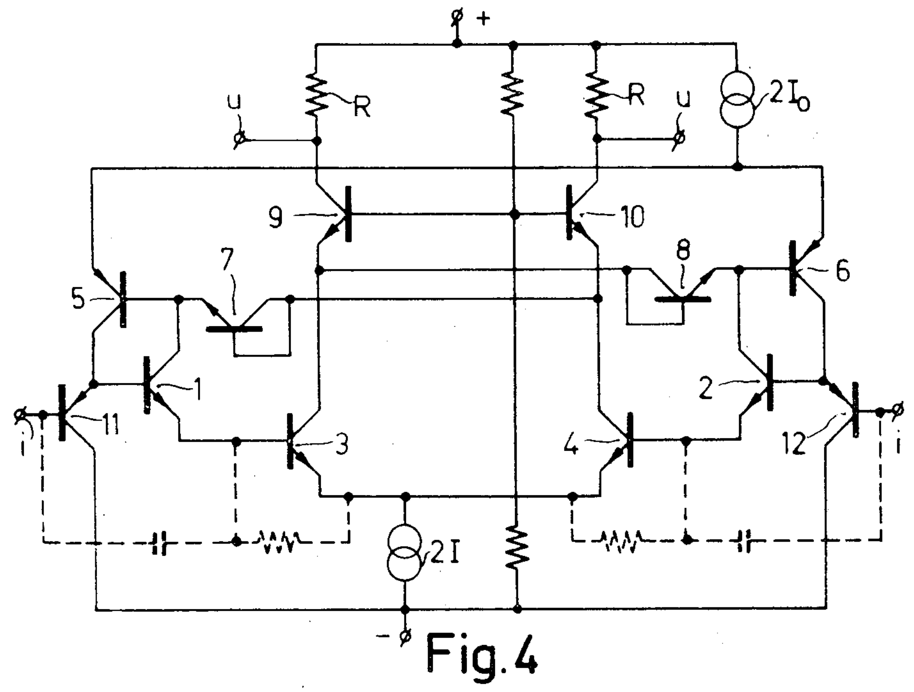

FIG. 4 shows a third embodiment of the circuit arrangement of the invention. The compensation of the error voltage is obtained herein by applying it to the input. The arrangement comprises the difference amplifier having the transistors 1, 2, 3, 4, for example, of the npn-type. The base-emitter voltages of these transistors are reproduced in the same manner as described with reference to FIG. 2 by the transistors 7, 8, 9 and 10. The voltages obtained by this reproduction are applied to two transistors 5 and 6, which are in this case of the pnp-type and the emitter electrodes of which are connected to each other and via a current source to the positive supply terminal. Connected in series with the emitter-collector paths of transistors 5 and 6 are the emitter-collector paths of further pnp-transistors 11 and 12, respectively, whose collector electrodes are connected to the negative supply terminal. The emitter of transistor 11 and that of transistor 12 are connected to the bases of transistors 1 and 2, respectively. Finally the input voltage is applied between the base electrodes of transistors 11 and 12.

The operation of the arrangement may be explained by supposing the collector current of transistor 3 to be: $Ic_3 = I(1 + x)$ and that of transistor 4 to be: $Ic_4 = I(1 - x)$. It therefore applies to the base-emitter voltage of transistor 3 that $Vbe_3 = Vbe_{03} + x(kT/q)$ and that of transistor 4: $Vbe_4 = Vbe_{04} - x$kT/q). If the current amplification factors of the output transistors 3 and 4 are designated by the same values as in FIG. 2, the base current of transistor 3 is: $Ib_3 = I/\beta\,(I + x - 2\,\delta)$ and that of transistor 4 is:$Ib_4 = I/\beta\,(1 - x + 2\,\delta)$. Because of this current the base-emitter voltage of transistor 1 is: $Vbe_1 = Vbe_{01} + (x - 2\,\delta)(kT/q)$. The voltage between the base of transistor 1 and the emitter of transistor 3 thus contains the error voltage depending upon $\delta$.

The transistors 7 and 10 reproduce the base-emitter voltages of transistors 1 and 4 so that the base voltage of transistor 5 only depends upon $\delta$, it being again a condition that the base current of transistor 5 should be negligible as compared with the collector current of transistor 1. If the steady current is $Io$, the collector current of transistor 5 is: $Ic_5 = Io(1 - 2\,\delta)$. This is also the current passing through transistor 11 when the base current of transistor 1 can be neglected, which can be readily achieved. The base-emitter voltage of transistor 11 is thus reduced by $2\,\delta\,(kT/q)$. The voltage between the base of transistor 11 and the emitter of transistor 2 is thus in total $2x\,(kT/q)$ apart from the constant component and this has to be equal to the input voltage $+\Delta\,(kT/q)$ at the base of transistor 11. Therefore: $x = \Delta/2$, which is independent of the difference between the current amplification factors of the output transistors.

The arrangement can be made suitable for higher frequencies by including a capacitor between the base of transistor 11 and the base of transistor 3 and a further capacitor between the bases of transistors 12 and 4 and by shunting the base-emitter paths of transistors 3 and 4 by resistors as is indicated in broken lines in the Figure. In this way the first amplifying stage is short-circuited for higher frequencies.

FIG. 5 shows an embodiment in which, as in FIG. 3, only the base-emitter voltages of the transistors 1 and 2 are reproduced. The operation is otherwise identical to that of the preceding arrangement, but the steepness is doubled since the signal voltage also is fed back to the input.

FIG. 6 shows a variant of FIG. 4 in which only npn-type transistors are employed. The base-emitter voltages of the transistors 1, 2, 3 and 4 are reproduced in the same manner as in FIG. 4. The emitter of transistor 7 is, however, not connected to the base of transistor 5 but to that of transistor 6 in the opposite stage of the amplifier, whereas the emitter of transistor 8 is now connected to the base of transistor 5.

With the same suppositions as in FIG. 4, the base voltage of transistor 5 is, apart from a constant voltage, equal to $-2\,\delta(kT/q)$. The current passing through transistor 5 is determined by the input voltage $+\Delta(kT/q$ so that this is the base-emitter voltage of transistor 5. The base voltage of transistor 1 is $-2\,\delta\,(kT/q) - \Delta\,(kT/q)$ which is equal to $2x(kT/q - 2\,\delta\,(kT/q)$. It follows therefrom that $x = \Delta/2$. Phase inversion occurs.

The arrangements of FIGS. 4, 5 and 6, as compared with those of FIGS. 1, 2 and 3, have the advantage that no additional resistors are required at the output of the difference amplifier and, moreover, that the current source $2Io$ need not satisfy a given condition. A disadvantage resides in the fact that two additional transistors are required. The arrangement of FIG. 6, as compared with that of FIG. 4, has the advantage that only transistors of the npn-type are required, which is highly advantageous in integrated circuits.

A variant of FIG. 6 is furthermore possible as far as only the base-emitter voltages of the transistors 1 and 2 are reproduced in the same manner as in FIG. 5. The emitter of transistor 7 is not connected to the base of transistor 5, but it is connected to that of transistor 6 and the emitter of transistor 8 is connected to the base of transistor 5 so that a kind of cross coupling is obtained. In this way two transistors are economized, i.e., the transistors 9 and 10, while the steepness of the amplifying circuit increases since signal voltage is fed back to the input.

What is claimed is:

1. A difference amplifier comprising a current source, a source of supply voltage, two pairs of transistors, means individually connecting the emitter electrodes of the first pair of transistors to the base electrodes of the second pair, respectively, means connecting the emitter electrodes of the second pair of transistors to each other and via said current source to one terminal of the supply source, first and second impedance elements, means individually connecting the collector electrodes of the second pair of transistors via respective ones of said impedances to the other terminal of the supply source, two pairs of terminals, means connecting the first pair of terminals to the base electrodes of the first pair of transistors and the second pair of terminals to the side of the collector impedances of the second transistor pair remote from the supply source, a pair of semiconductor elements individually coupled in the collector circuits of said first pair of transistors so that each semiconductor element is traversed by substantially the same current as its respective first transistor for deriving a compensation voltage by reproducing the base-emitter voltages of at least the first pair of transistors of the difference amplifier in the pn-junction of said semiconductor elements, and means for individually coupling said semiconductor elements to one pair of said terminals so as to apply said compensation voltage to said one pair of terminals in a compensating sense.

2. A difference amplifier as claimed in claim 1 further comprising a pair of compensation transistors connected in a long-tailed pair configuration to the supply source, and means individually connecting the base electrodes of the compensation transistors to the collector electrodes of the first pair of transistors.

3. A difference amplifier as claimed in claim 1 further comprising first and second compensation transistors having their emitter electrodes connected together, means connecting the side of each of the collector impedances of the second pair of transistors remote from the supply source via third and fourth respective impedance elements, from which the output voltage is derived, to the collector of a respective compensation transistor, and means connecting the emitter electrodes of the compensation transistors via a second current source to one terminal of the supply source, and means individually connecting the collector electrodes of the said first pair of transistors to the respective base electrodes of said compensation transistors.

4. A difference amplifier as claimed in claim 3 wherein said pair of semiconductor elements comprise third and fourth transistors each connected as a diode, said amplifier further comprising a third pair of transistors, and means connecting said third pair of transistors in circuit so that the collector circuit of each of the second pair of transistors includes the emitter-collector path of a transistor of said third pair of transistors, means connecting the base electrodes of the latter transistors to a point of fixed potential, and means individually connecting the collector electrodes of each of the second pair of transistors via said third and fourth transistors each connected as a diode in the pass direction to the collector electrodes of the opposite stage transistor of the first pair of transistors of the difference amplifier and furthermore to the base electrodes of the compensation transistors.

5. A difference amplifier as claimed in claim 2 further comprising means connecting the collector of each transistor of the first pair of transistors to the base of that compensation transistor whose collector is connected to the collector impedance of the opposite stage transistor of the second pair of transistors of the difference amplifier and, moreover, via at least one transistor connected as a diode in the pass direction to a point of constant potential.

6. A difference amplifier as claimed in claim 1 characterized in that each input of the first pair of transistors of the difference amplifier comprises two other transistors traversed in series by the same current, means connecting the common electrodes thereof to the base of the associated transistor of the first pair of transistors of the difference amplifier, and means for applying the signal voltage to the base of one transistor and the compensation voltage to the base of the second transistor of said two other transistors.

7. A difference amplifier as claimed in claim 6 further comprising a further pair of transistors with their base electrodes connected to a point of fixed potential, means for obtaining the compensation voltage by including in the collector circuit of each of the second pair of transistors the emitter-collector path of a further transistor, and means connecting the collector of the transistor of the second pair of transistors concerned via a transistor connected as a diode in the pass direction to the collector of the opposite stage transistor of the first pair of transistors and to the base of the associated compensation transistor.

8. A difference amplifier as claimed in claim 6 characterized in that the compensation voltage is obtained by connecting the collector of each transistor of the first pair of transistors via a transistor connected as a diode in the pass direction to a point of constant potential and, in addition, directly to the base of the associated compensation transistor.

9. A difference amplifier adapted to be energized from a source of supply voltage comprising, a current source, first and second input transistors, a pair of signal input terminals coupled to the base electrodes of said input transistors, third and fourth output transistors, means connecting the emitter of the first transistor to the base of the third transistor and the emitter of the second transistor to the base of the fourth transistor, means connecting the emitter electrodes of said third and fourth transistors together and to one terminal of the supply source via said current source, first and second impedance elements, means including said first impedance element for coupling the collector of said third transistor to the other terminal of the supply source, means including said second impedance element for coupling the collector of said fourth transistor to said other terminal of the supply source, first and second semiconductor elements each having a PN-junction, means for coupling the collector electrodes of said first and second input transistors to said other supply source terminal via said first and second semiconductor elements, respectively, so that the semiconductor elements and the respective input transistors are traversed by substantially the same currents whereby the base-emitter voltages of the input transistors are reproduced in the PN junctions of said semiconductor elements as a compensation voltage for compensating any error voltage produced by a difference in the current amplification factors of the output transistors, a pair of signal output terminals individually coupled to the collector electrodes of the output transistors, and means for applying said compensation voltages to one pair of said terminals in a compensating sense.

10. A difference amplifier as claimed in claim 9 further comprising first and second compensation transistors with their emitter electrodes connected together and to said one supply source terminal via a current source, means for coupling the collector electrodes of said first and second compensation transistors to said first and second impedance elements, respectively, and means for individually coupling said first and second semiconductor elements to the base electrodes of said first and second compensation transistors thereby to apply said compensation voltages thereto.

11. A difference amplifier as claimed in claim 10 wherein said collector coupling means for the output transistors comprises fifth and sixth transistors connected in series with the third and fourth transistors, respectively, and the first and second impedance elements, respectively, and means connecting the base electrodes of said fifth and sixth transistors to a point of fixed potential.

12. A difference amplifier as claimed in claim 10 further comprising means individually connecting the collector electrodes of the input transistors to the base electrodes of the compensation transistors and to a point of constant voltage via said first and second semiconductor elements, respectively.

13. A difference amplifier as claimed in claim 9 further comprising fifth and sixth transistors connected in series across the supply terminals and having a common junction connected to the base of the first input transistor, one of said input terminals being connected to the base of the fifth transistor and one of said semiconductor elements being connected to the base of the sixth transistor to apply thereto said compensation voltage, seventh and eighth transistors connected in series across the supply terminals and having a common junction connected to the base of the second input transistor, the other one of said input terminals being connected to the base of the seventh transistor and the other one of said semiconductor elements being connected to the base of the eighth transistor to apply thereto said compensation voltage.

14. A difference amplifier as claimed in claim 13 further comprising means for connecting the collector electrodes of said first and second input transistors to a point of fixed potential via said first and second semiconductor elements, respectively, and directly to the base electrodes of said sixth and eighth transistors, respectively.

15. A difference amplifier as claimed in claim 13 wherein said collector coupling means for the output transistors comprises ninth and tenth transistors connected in series with the third and fourth transistors, respectively, and the first and second impedance elements, respectively, and means connecting the base electrodes of said ninth and tenth transistors to a point of fixed potential.

* * * * *